United States Patent
Hong et al.

(10) Patent No.: US 11,134,566 B2
(45) Date of Patent: Sep. 28, 2021

(54) APPARATUS FOR FABRICATING STRETCHABLE ELECTRICAL CIRCUIT

(71) Applicant: Seoul National University R&DB Foundation, Seoul (KR)

(72) Inventors: Yongtaek Hong, Seoul (KR); Byeongmoon Lee, Cheongju-si (KR); Junghwan Byun, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/925,865

(22) Filed: Jul. 10, 2020

(65) Prior Publication Data
US 2020/0344877 A1   Oct. 29, 2020

Related U.S. Application Data

(62) Division of application No. 15/594,766, filed on May 15, 2017, now Pat. No. 10,757,803.

(30) Foreign Application Priority Data

May 13, 2016   (KR) .................. 10-2016-0058723

(51) Int. Cl.
*H05K 3/00* (2006.01)
*H05K 1/02* (2006.01)
(Continued)

(52) U.S. Cl.
CPC ......... *H05K 1/0283* (2013.01); *H05K 1/0269* (2013.01); *H05K 3/0044* (2013.01);
(Continued)

(58) Field of Classification Search
CPC ........ H05K 3/0044; H05K 3/12; H05K 3/22; H05K 3/303; H05K 2203/0271;
(Continued)

(56) References Cited

U.S. PATENT DOCUMENTS 5,206,749 A * 4/1993 Zavracky .......... H01L 29/78654
                                                  349/45
6,999,835 B2    2/2006 Kodama
                (Continued)

FOREIGN PATENT DOCUMENTS

| JP | 2014-151261 A | 8/2014 |
| JP | 2016-072420 A | 5/2016 |
| WO | WO 2014/203586 A1 | 12/2014 |

OTHER PUBLICATIONS

Korean Notice of Allowance for related KR application No. 10-2016-0058723 dated Jul. 4, 2018 from Korean Patent Office.

*Primary Examiner* — Donghai D Nguyen
(74) *Attorney, Agent, or Firm* — Paratus Law Group, PLLC

(57) ABSTRACT

Disclosed is an apparatus for fabricating a stretchable electrical circuit, including: a stretching device configured to stretch a mounted stretchable substrate in two different directions; a marking device configured to mark a mark on the stretchable substrate; an image device configured to obtain an image of the stretchable substrate on which a plurality of alignment marks are marked by the marking device; and a control device configured to control the stretching device, the image device, and the marking device. The control device forms a first axis and a second axis using the plurality of alignment marks marked on the image obtained by the image device and marks one point of a surface of the stretchable substrate with coordinates made by the first axis and the second axis using the first axis and the second axis.

8 Claims, 9 Drawing Sheets

(51) Int. Cl.
*H05K 3/12* (2006.01)
*H05K 3/22* (2006.01)
*H05K 3/30* (2006.01)

(52) U.S. Cl.
CPC ............... *H05K 3/12* (2013.01); *H05K 3/22* (2013.01); *H05K 3/303* (2013.01); *H05K 2203/0271* (2013.01); *H05K 2203/163* (2013.01); *H05K 2203/166* (2013.01); *Y02P 70/50* (2015.11)

(58) Field of Classification Search
CPC ....... H05K 2203/163; H05K 2203/166; H05K 3/326; H05K 1/0283; H05K 1/0269; H05K 13/08; Y02P 70/50; Y10T 29/4913; Y10T 29/49155; Y10T 29/53178; Y10T 29/53265
USPC ................... 29/832, 846, 740, 760
See application file for complete search history.

(56) References Cited

U.S. PATENT DOCUMENTS

| | | | |
|---|---|---|---|
| 8,552,299 B2 | 10/2013 | Rogers et al. | |
| 8,886,350 B2 | 11/2014 | Yamada et al. | |
| 10,123,470 B2 * | 11/2018 | Itoh | H05K 13/0465 |

* cited by examiner (a)  (b)

(a)  (b)

APPARATUS FOR FABRICATING STRETCHABLE ELECTRICAL CIRCUIT

CROSS-REFERENCE TO RELATED APPLICATIONS

This application is a Divisional Application of U.S. patent application Ser. No. 15/594,766 filed on May 15, 2017, which claims priority to Korean Patent Application No. 10-2016-0058723, filed on May 13, 2016, which are all hereby incorporated by reference in their entirety.

BACKGROUND

The present invention relates to a method of fabricating a stretchable electrical circuit and an apparatus for fabricating a stretchable electrical circuit.

A conventional stretchable electrical circuit is formed by forming rigid regions, which are harder than a stretchable substrate, on the stretchable substrate, disposing electrical components in the rigid regions, and electrically connecting rigid islands. Processes of disposing the electrical components and electrically connecting the rigid islands are manually performed by users themselves.

SUMMARY

Even when a uniform tensile force is applied on a stretchable substrate, a stretching degree of the stretchable substrate varies due to various factors including a relationship among a layout of rigid regions on the stretchable substrate, hardness of the rigid regions, and the stretchable substrate. Accordingly, processes of electrically wiring rigid regions and disposing active components, passive components, and the like in the rigid regions cannot be automatically performed.

The present invention is directed to provide a method of automatically fabricating a stretchable electrical circuit and an apparatus for automatically fabricating a stretchable electrical circuit in order to solve a problem which was not solved by the conventional art, and to provide a method and device capable of more economically fabricating a stretchable electrical circuit.

According to an aspect of the present invention, there is provided a method of fabricating a stretchable electrical circuit, which includes stretching a stretchable substrate, forming a plurality of alignment marks on a surface of the stretchable substrate, forming a first axis extending from a line connecting two alignment marks among the plurality of alignment marks and a second axis perpendicular to the first axis, marking one point of the surface of the stretched stretchable substrate with coordinates made by the first axis and the second axis, and disposing electrical components using the coordinates.

According to another aspect of the present invention, there is provided an apparatus for fabricating a stretchable electrical circuit, which includes a stretching device configured to stretch a mounted stretchable substrate in two different directions, a marking device configured to mark a mark on the stretchable substrate, an image device configured to obtain an image of the stretchable substrate on which a plurality of alignment marks are marked by the marking device, and a control device configured to control the stretching device, the image device, and the marking device, wherein the control device forms a first axis and a second axis using the plurality of alignment marks marked on the image obtained by the image device and marks one point of a surface of the stretchable substrate with coordinates made by the first axis and the second axis using the first axis and the second axis.

According to embodiments of the present invention, a surface of a stretched stretchable substrate may be marked with coordinates, and thereby a process of disposing electrical components on the surface of the stretched stretchable substrate may be automatically performed.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION

Figure 1:
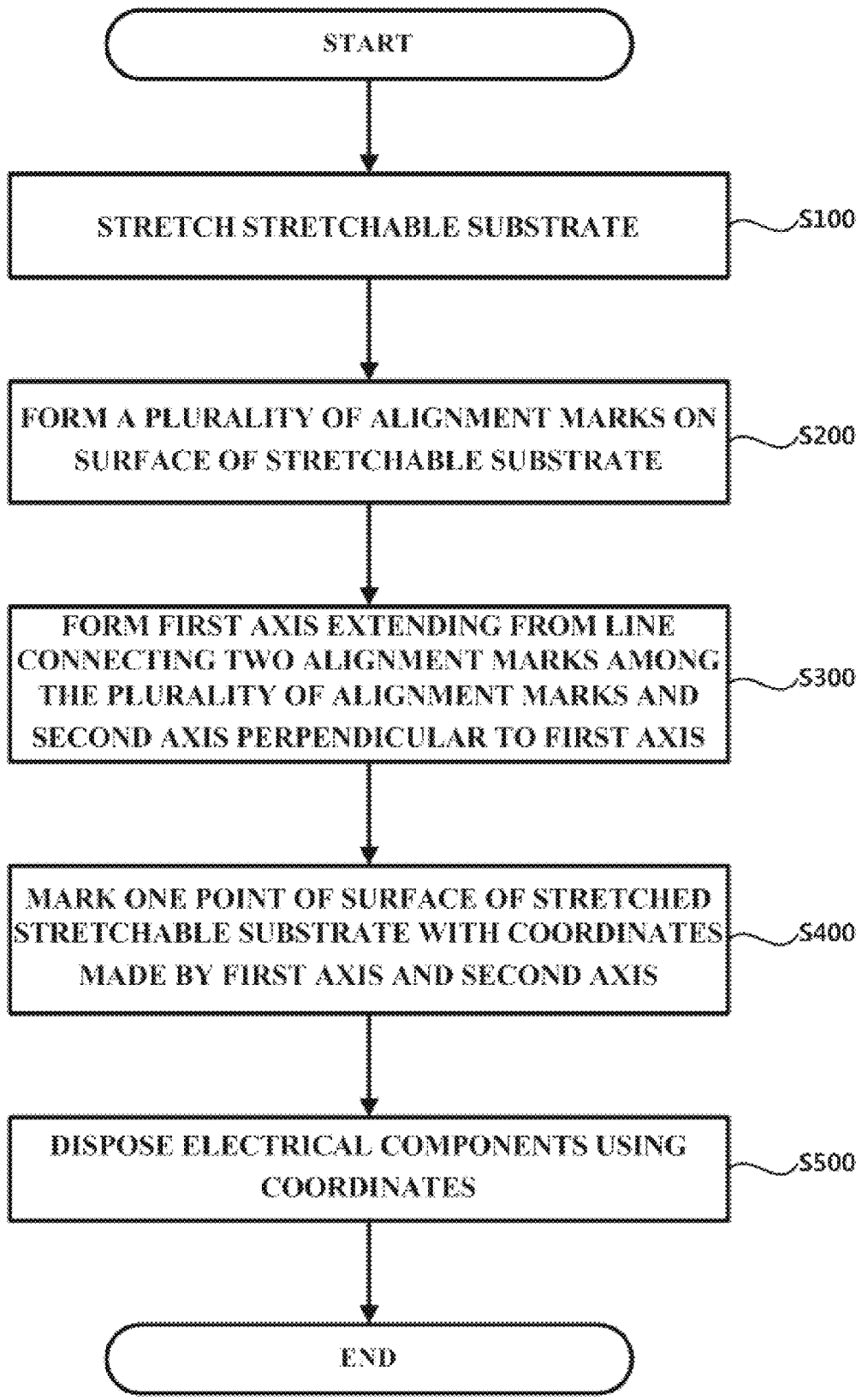
FIG. 1 is a flowchart schematically illustrating a method of fabricating a stretchable electrical circuit according to an embodiment.
Figure 2:
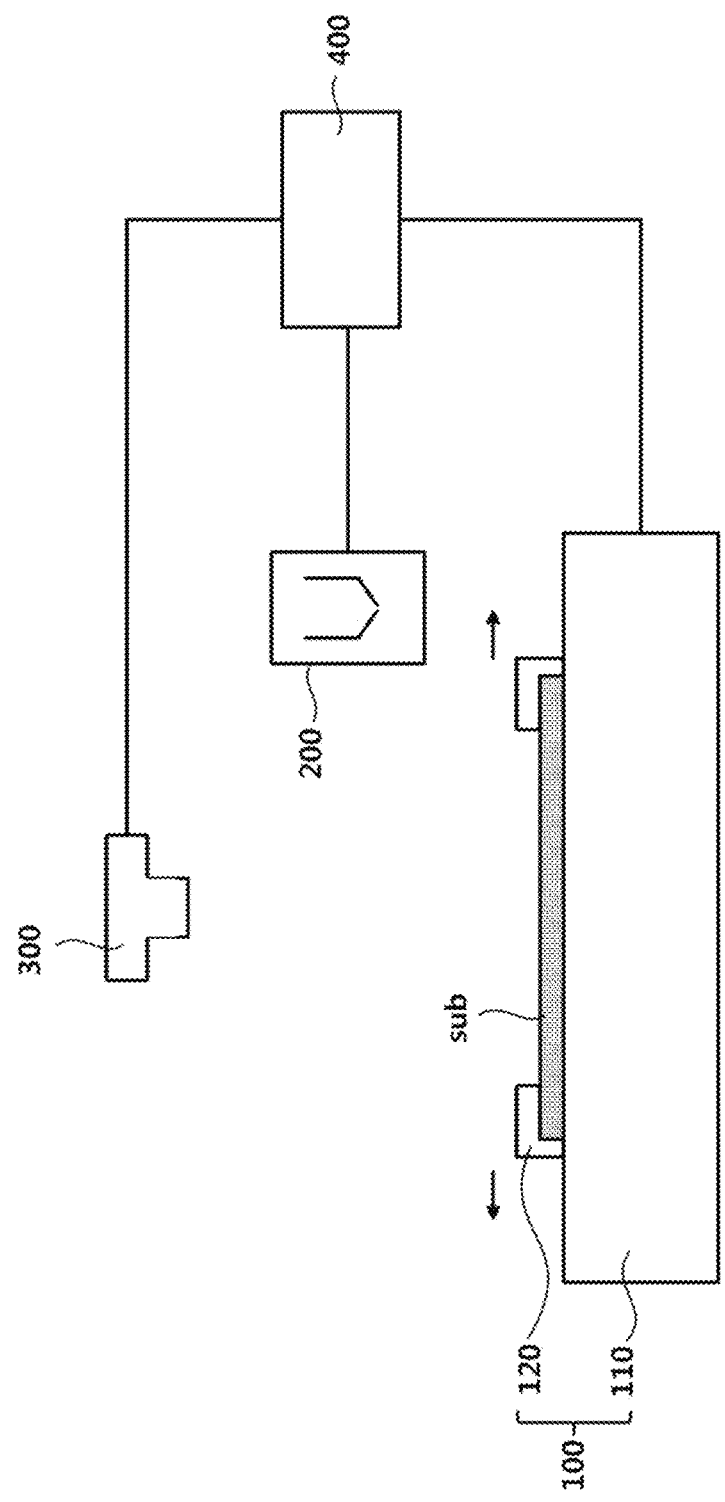
FIG. 2 is a schematic view illustrating a configuration of an apparatus for fabricating a stretchable electrical circuit according to an embodiment.

Hereinafter, a method of fabricating a stretchable electrical circuit and an apparatus for fabricating a stretchable electrical circuit according to embodiments of the present invention will be described with reference to the accompanying drawings. FIG. 1 is a flowchart schematically illustrating a method of fabricating a stretchable electrical circuit according to an embodiment, and FIG. 2 is a schematic view illustrating a configuration of an apparatus for fabricating a stretchable electrical circuit according to an embodiment. Referring to FIGS. 1 and 2, the method of fabricating a stretchable electrical circuit according to the embodiment includes stretching a stretchable substrate (S100), forming a plurality of alignment marks on a surface of the stretchable substrate (S200), forming a first axis extending from a line connecting two alignment marks among the plurality of alignment marks and a second axis perpendicular to the first axis (S300), marking one point of the surface of the stretched stretchable substrate with coordinates made by the first axis and the second axis (S400), and disposing electrical components using the coordinates (S500).

The apparatus for fabricating a stretchable electrical circuit according to the embodiment includes a stretching device 100 configured to stretch a mounted stretchable substrate sub in two different directions, a marking device 200 configured to mark a mark on the stretchable substrate sub, an image device 300 configured to obtain an image of the stretchable substrate sub on which the plurality of alignment marks are marked by the marking device 200, and a control device 400 configured to control the stretching device 100, the image device 300, and the marking device 200, wherein the control device 400 forms a first axis and a second axis using the plurality of alignment marks marked on the image obtained by the image device 300 and marks one point of the surface of the stretchable substrate sub with coordinates made by the first axis and the second axis using the first axis and the second axis.

The stretching device 100 includes a mounting part 110 on which the stretchable substrate sub is positioned and a fixing member 120 which fixes the stretchable substrate and stretches the stretchable substrate in two perpendicular directions with the same force. The marking device 200 prints and marks a plurality of alignment marks A1 and A2 and wirings on the stretched substrate. In one embodiment, the marking device 200 is a printing device. The marking device 200 may form wirings using a transfer printing process of printing wirings on an insulating layer with an ink deposited on a mold as shown in FIG. 3A, an inkjet printing process of forming wirings by spraying an ink through a nozzle as shown in FIG. 3B, or a gravure printing and roll-to-roll printing process of printing wirings on an insulating layer with an ink using a roller as shown in FIG. 3C. For example, an ink used in a printing process may be a conductive ink including a conductive material.

The image device 300 has a light axis disposed to be perpendicular to the surface of the stretchable substrate sub, photographs the surface of the stretchable substrate sub to obtain an image, and converts the obtained image into electrical signals to provide the electrical signals to the control device 400. The control device 400 provides the electrical signals to the stretching device 100, the marking device 200, and the image device 300 and controls the stretching device 100, the marking device 200, and the image device 300. For example, the control device 400 may be implemented as a computer or may be implemented as a micro controller.

Figure 3:
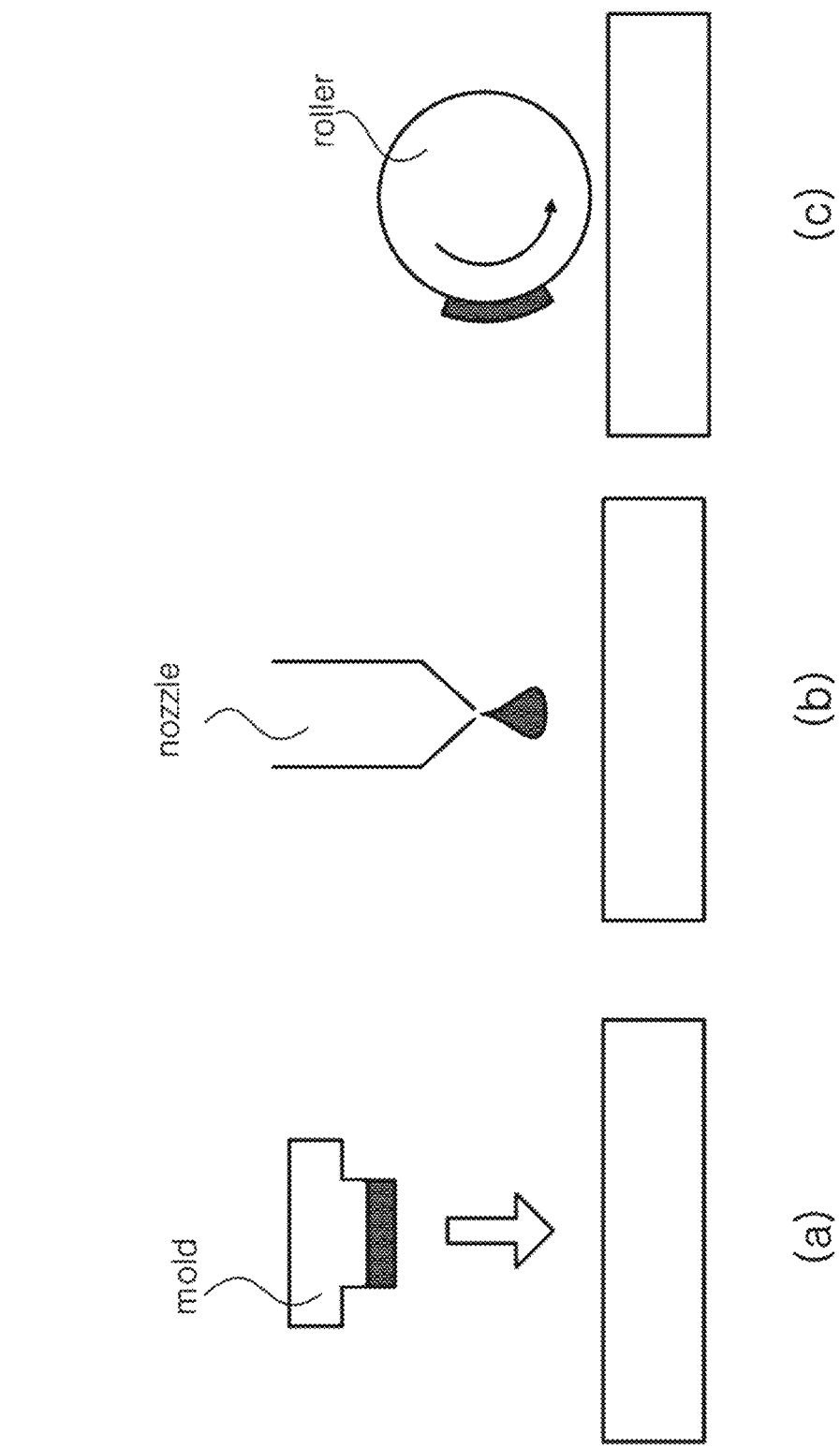
FIG. 3 is a schematic view illustrating a marking device.
Figure 4:
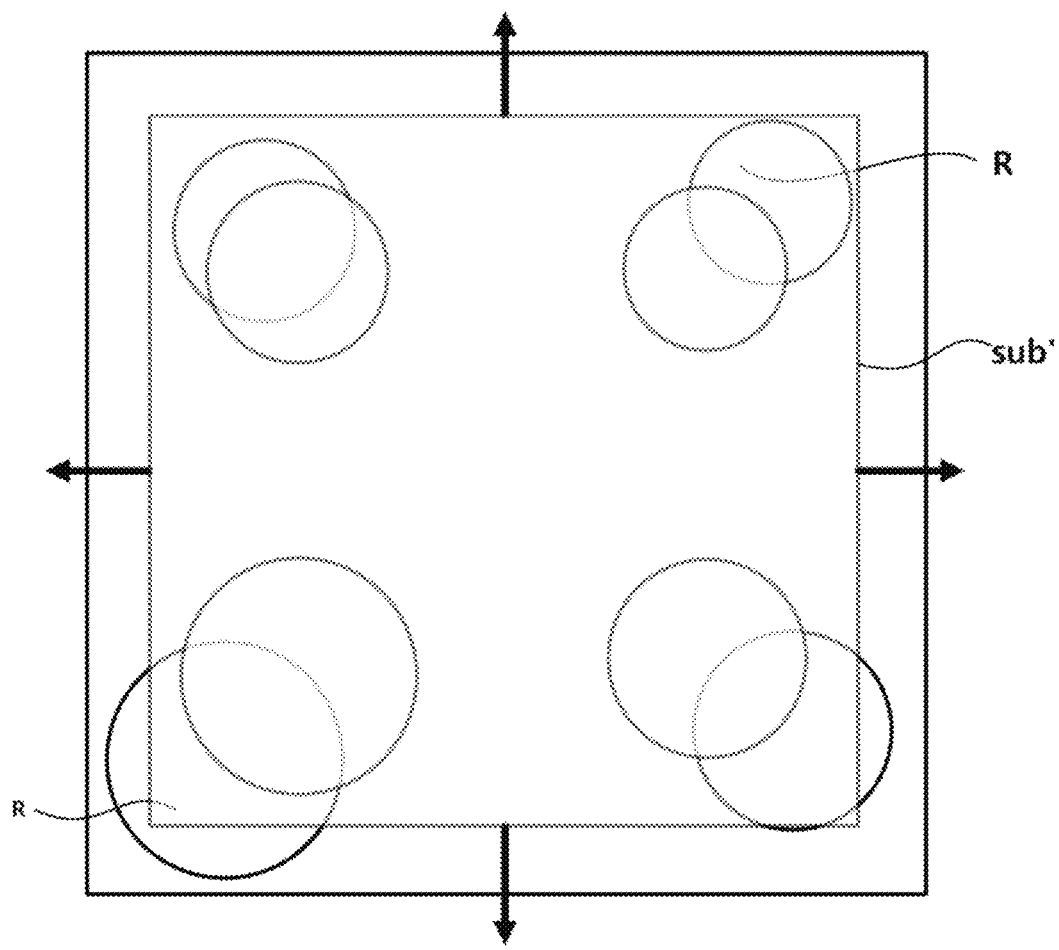
FIG. 4 is a schematic view illustrating a case in which a stretchable substrate mounted on a stretching device stretches in two different directions.

Hereinafter, an operation of the apparatus for fabricating a stretchable electrical circuit according to the embodiment and the method of fabricating a stretchable electrical circuit will be described with reference to the accompanying drawings. FIG. 4 is a schematic view illustrating a case in which a stretchable substrate mounted on a stretching device stretches in two different directions. Referring to FIGS. 1 to 4, the stretching device 100 stretches the mounted stretchable substrate sub by applying the same tensile force thereon along two perpendicular axes (S100). Since the stretching device 100 applies the same force on the stretchable substrate sub in the perpendicular directions and stretches the stretchable substrate sub, a stretchable substrate sub' on which a tensile force is not applied yet is isotropically stretched by a tensile force provided by the stretching device 100 in the two perpendicular directions.

For example, the stretchable substrate sub may be formed of an elastomer which is a polymer material which may extend or be deformed and may be restored to an original form without permanent deformation. For example, the elastomer may include a polymer, a copolymer, a composite material, or a mixture of a polymer and a copolymer. An elastomer layer refers to a layer including at least one elastomer. The elastomer layer may also include a dopant and a non-elastomer. An elastomer useful for the embodiment may include a thermoplastic elastomer, a styrenic material, an olefenic material, polyolefin, a polyurethane thermoplastic elastomer, polyamide, synthetic rubber, polydimethylsiloxane (PDMS), polybutadiene, polyisobutylene, poly styrene-butadiene-styrene, polyurethane, polychloroprene, or silicone, but the elastomer is not limited thereto. The elastomer provides an elastomeric stamp useful for the method according to the embodiment.

In one embodiment, rigid islands R are located on the stretchable substrate sub. The rigid islands may be formed by the following process. A sacrificial layer is formed on a rigid substrate. An upper structure and a lower structure of the sacrificial layer may be separated by dissolving the sacrificial layer in a specific solvent. In one embodiment, the sacrificial layer may be formed of poly vinyl alcohol (PVA).

A support layer is formed on the sacrificial layer and is cured. For example, the support layer may be a PDMS layer. A thermoplastic liquid is disposed on the support layer to form a desired rigid island pattern. For example, the thermoplastic liquid is polymethyl methacrylate (PMMA) and is cured to form the rigid islands. In one embodiment, a process of forming a thermoplastic liquid pattern on a support layer may be performed using a printing method such as an inkjet printing method, a gravure printing method, a roll-to-roll printing method, a transfer printing method, or the like as shown in FIG. 3. In another embodiment, a process of forming a thermoplastic liquid pattern on a support layer may be performed using a dispenser apparatus.

Then, a thermal process is performed, a cover layer is formed to have a desired thickness, and then a curing process is performed. In one embodiment, a thermal process may be an annealing process and may be performed at 50 to 150° C. In one embodiment, the cover layer may be a PDMS layer. Then, the cover layer is cured, and the sacrificial layer is removed using a solvent so that the rigid substrate may be separated from the support layer and a stretchable substrate having rigid islands may be formed.

Since the rigid islands R are harder than the stretchable substrate sub, deformation degrees of a cross section and a shape thereof are lower than a deformation degree of the stretchable substrate sub even when the stretching device 100 applies a tensile force on the rigid islands R. Accordingly, active components, passive components, and a substrate, on which active components and passive components are disposed and wired to perform desired functions, may be disposed on the rigid islands R, which will be described below, so that an operating reliability may be insured to perform desired functions without destruction of the active components, the passive components, and the substrate even when stress, which is generated when the stretchable substrate sub is stretched or restored to an original shape thereof, is applied thereto.

Figure 5:
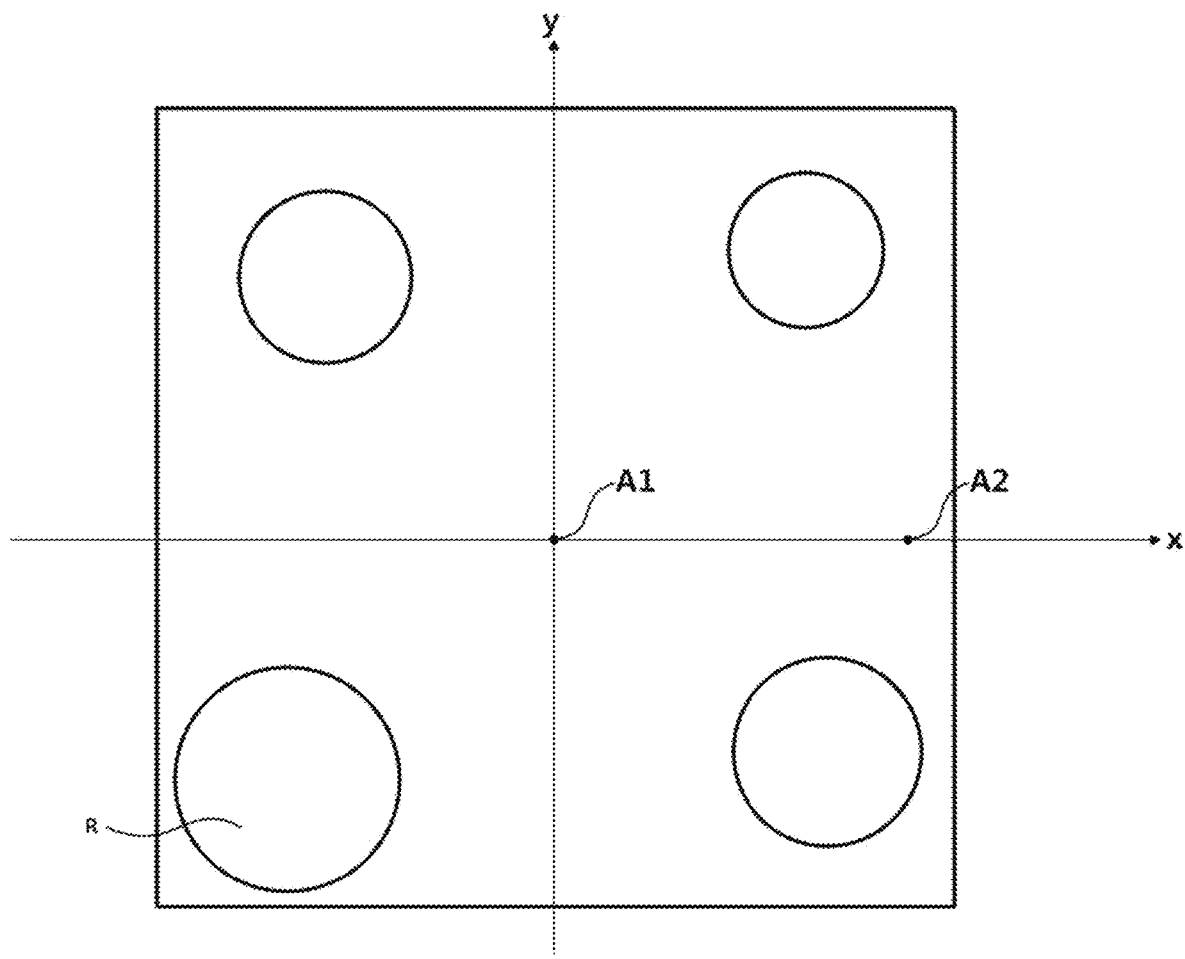
FIG. 5 is a schematic view illustrating a plurality of alignment marks formed on a stretched stretchable substrate.

FIG. 5 is a schematic view illustrating a plurality of alignment marks A1 and A2 formed on a stretched stretchable substrate sub. Referring to FIGS. 1, 2, and 5, the control device 400 controls the marking device 200 to form the plurality of alignment marks A1 and A2 (S200). For example, the control device 400 controls the marking device 200 to form the plurality of alignment marks A1 and A2 after the stretchable substrate sub is stretched. In another example, the control device 400 controls the marking device 200 to form the plurality of alignment marks A1 and A2 before the stretchable substrate sub is stretched.

In the embodiment shown in FIG. 5, two alignment marks A1 and A2 may be formed. In another embodiment (not shown), four alignment marks may be formed to be located at vertices of a quadrangle or three alignment marks may be formed to be located at three vertices of a quadrangle except one vertex thereof. In still another embodiment (not shown), the control device 400 may control the marking device 200 to form five or more alignment marks.

Figure 6:
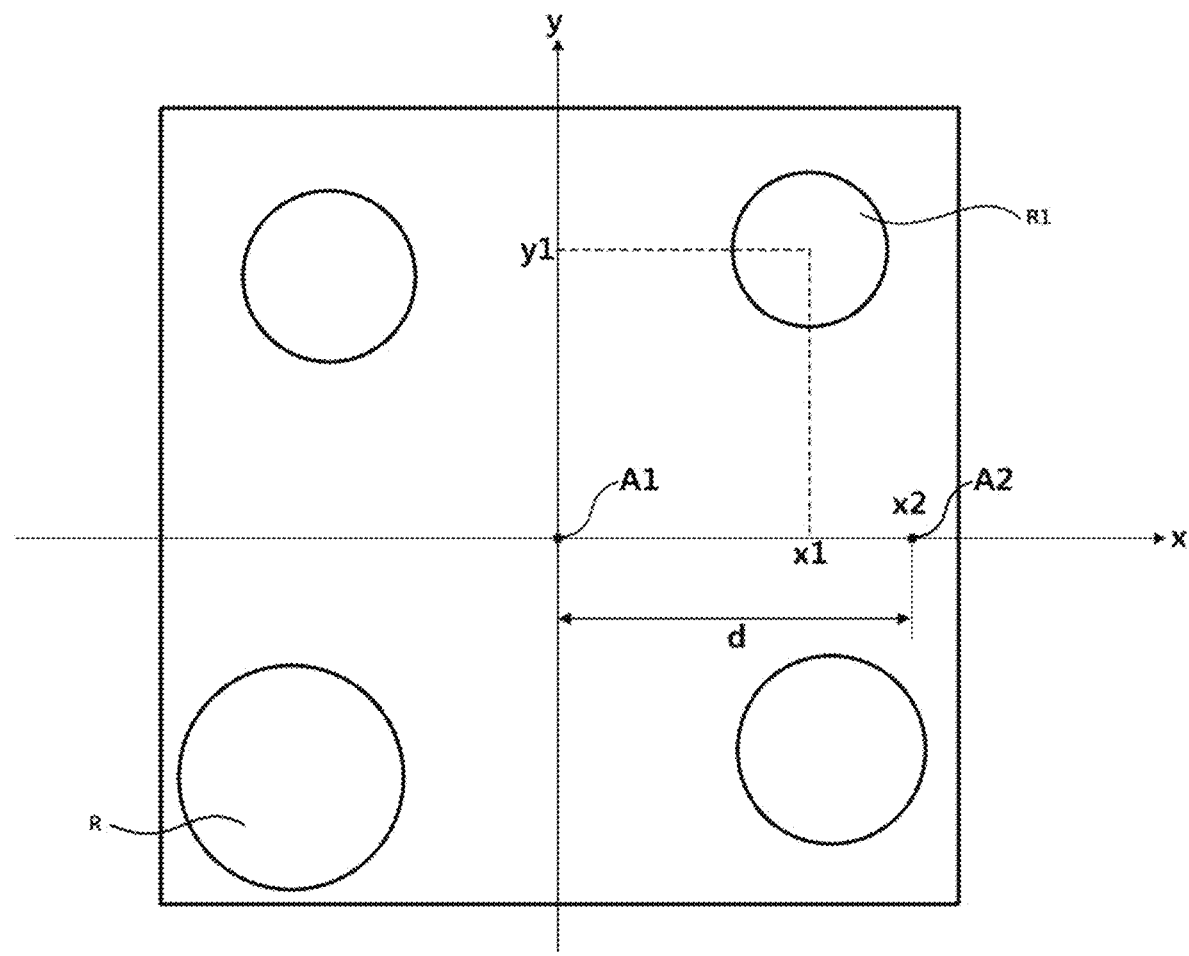
FIG. 6 is a schematic view illustrating a first axis and a second axis formed using alignment marks.

FIG. 6 is a schematic view illustrating a first axis and a second axis formed using the alignment marks A1 and A2. Referring to FIG. 6, the control device 400 controls the image device 300 to obtain an image of a surface of the stretchable substrate sub on which a plurality of alignment marks A are formed. In one embodiment, the image device 300 photographs the image of the surface of the stretchable substrate sub at a location in a direction of a light axis perpendicular to the surface of the stretchable substrate sub. For example, the image device 300 is a digital camera including an optical device, such as a lens and the like, and an image sensor converting an optical image provided by the optical device into an electrical signal. Since an image provided by the image device 300 is photographed at the location in the direction of the light axis perpendicular to the surface of the stretchable substrate sub, an image distortion based on a photographed location can be reduced.

The control device 400 receives the image of the surface of the stretchable substrate sub on which the plurality of alignment marks A1 and A2 are formed from the image device 300, and forms a first axis x, which is a virtual line extending from a line connecting the two alignment marks A1 and A2, and a second axis y which is a virtual line perpendicular to the first axis (S300). The control device 400 forms the first axis x and the second axis y by processing the image provided by the image device 300. As shown in the embodiment, the control device 400 may control the marking device 200 to form the plurality of alignment marks so that one of the plurality of alignment marks A1 and A2 is located at a central portion of the stretchable substrate sub, and the formed first axis x and second axis y may have a starting point which is an alignment mark A1 located at the central portion of the stretchable substrate. In another embodiment (not shown), one of the plurality of alignment marks A1 and A2 may be located at a corner of the stretchable substrate sub, and the formed first axis x and second axis y may have a starting point which is an alignment mark located at the corner of the stretchable substrate.

In another embodiment (not shown), the control device 400 may control the marking device 200 to form three alignment marks A. Among the three alignment marks A, one alignment mark may be a starting point, a first axis x may be a line connecting the starting point and another alignment mark, and a second axis y may be a line connecting the starting point and the other alignment mark.

FIG. 6 is a schematic view which marks one point of the surface of the stretched stretchable substrate sub with coordinates made by the first axis x and the second axis y. Referring to FIG. 6, the control device 400 receives an image obtained by the image device 300 and marks one point of the surface of the stretchable substrate sub with coordinates of a coordinate system formed by the first axis x and the second axis y (S400).

In one embodiment, the control device 400 may mark regions of the stretchable substrate sub, which are uniformly divided by the first axis x and the second axis y and stretched, with coordinates of a coordinate system formed by the first axis x and the second axis y. The control device 400 forms one alignment mark on the surface of the stretched stretchable substrate sub and then forms another alignment mark to be spaced a predetermined distance d from the one alignment mark. Accordingly, when a proportion of coordinates of another alignment mark and the predetermined distance d is considered, a distance between the alignment marks calculated by a coordinate system and an actual distance between the alignment marks on the surface of the stretched stretchable substrate sub may be calculated.

For example, a distance between a starting point and the center of a rigid island R1 whose center is located at coordinates of x1 and y1 is calculated by the formula of $\sqrt{x1^2+y1^2}$ in a coordinate system formed by a first axis x and a second axis y. Further, a distance between the starting point and an alignment mark located at coordinates of x2 and 0 is x2 (x2>0) in the coordinate system, and an actual distance between the alignment mark and the starting point on the surface of the stretchable substrate sub is d. Accordingly, an actual distance dr between the center of the rigid island R1 and the starting point on the surface of the stretchable substrate sub is obtained by a proportional relationship of the following Equation 1.

$$d_r = d \frac{\sqrt{x1^2 + y1^2}}{x2} \qquad \text{Equation 1}$$

Accordingly, the control device 400 may correspond a location having coordinates made by the first axis x and the second axis y and an actual location on the stretchable substrate sub with 1:1. For example, when a wiring is made to connect two different points on the substrate sub in a straight line form, the control device 400 may obtain coordinates of the two points and may calculate a length of the wiring formed on a surface of the stretchable substrate sub and a distance moved by a marking device to form the wiring using the coordinates.

In another embodiment, the control device 400 may control the marking device 200 to form alignment marks before a stretchable substrate is stretched. The control device 400 may measure and obtain a distance between alignment marks using measuring gradations displayed on the stretching device 100 after the stretchable substrate sub is stretched. Further, since the stretching device 100 stretches the stretchable substrate sub in perpendicular directions with the same force, the stretchable substrate is uniformly stretched in the perpendicular directions. Accordingly, an actual distance can be calculated with respect to an arbitrary location of the surface of the stretchable substrate sub on the basis of the distance d between the alignment marks formed along the first axis x.

Figure 7:
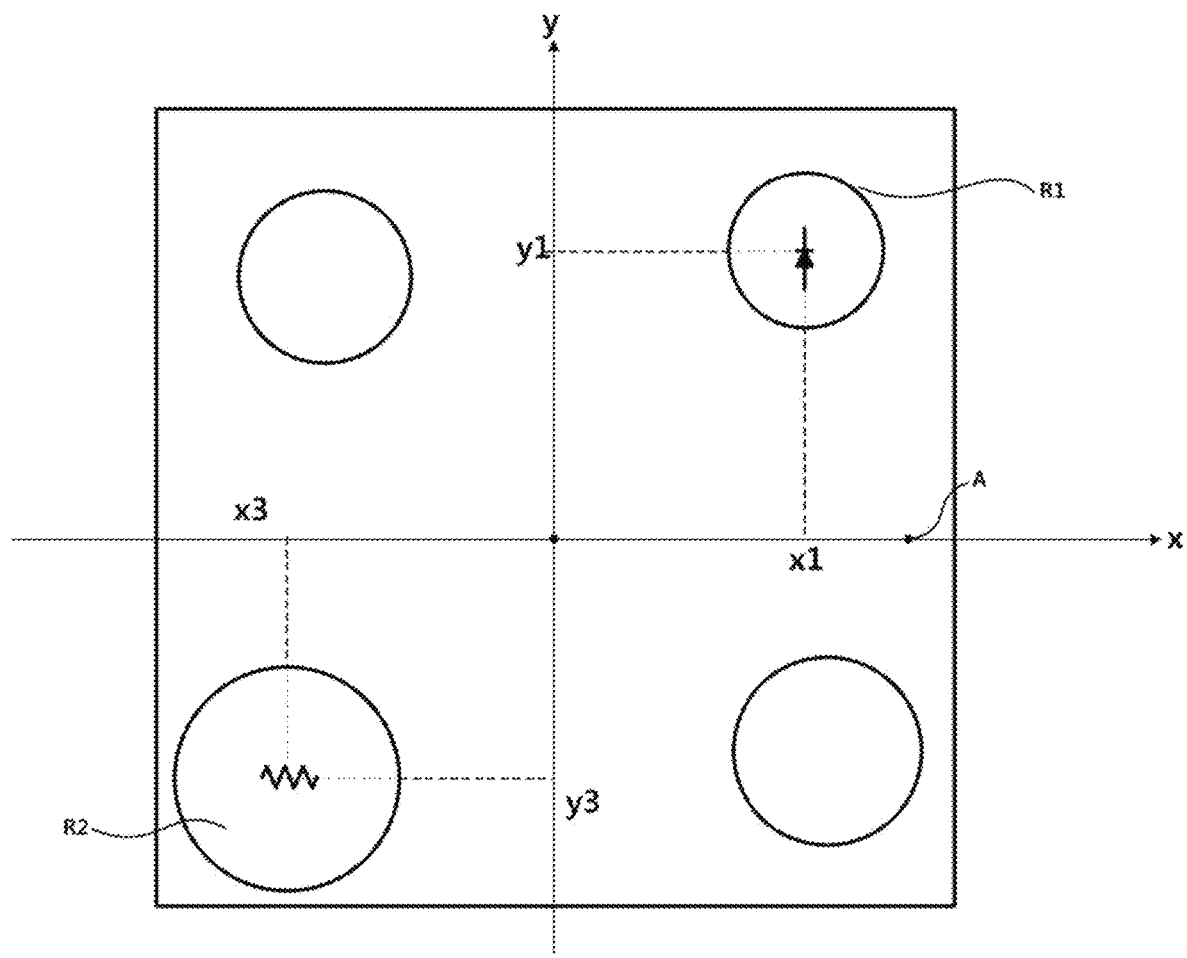
FIGS. 7 and 8 are schematic views illustrating a process of disposing electrical components using coordinates.
Figure 8:
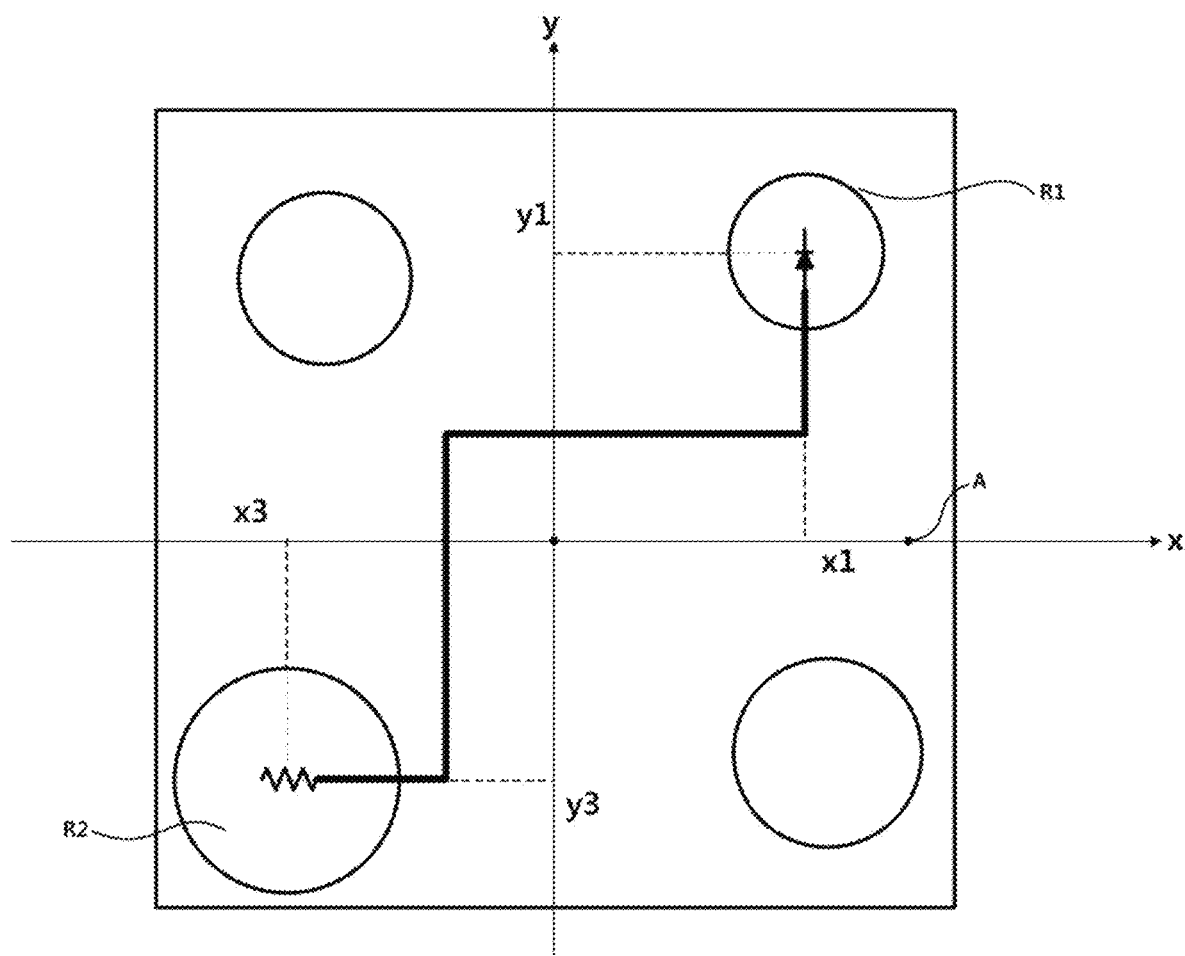

FIGS. 7 and 8 are schematic views illustrating a process of disposing electrical components using coordinates. An embodiment of present invention is assumed that a conductive wiring, which is an electrical component, is disposed to connect one electrode of a diode D, which is disposed on a rigid island R1 whose center has coordinates of x1 and y1, and one electrode of a resistor R disposed on a rigid island R2 whose center has coordinates of x3 and y3.

FIG. 7 is a schematic view illustrating a process of determining locations of rigid islands. The control device 400 determines locations of rigid islands by processing an image of a surface of the stretchable substrate sub provided by the image device 300. The control device 400 determines that the center of a rigid island R1 has coordinates of x1 and y1 and the center of a rigid island R2 has coordinates of x3 and y3, wherein the centers will be wired.

In one embodiment, during a process of determining the locations of the rigid islands, coordinates of the centers of the rigid islands, radii and diameters of the rigid islands, and the like may be determined. Further, a user of a system may directly determine the locations of the rigid islands and may input the locations to the control device 400.

Although the embodiments of FIGS. 7 and 8 show examples in which a premade component is disposed on the rigid island R1, a thin film transistor (TFT) formed by performing a printing process, a light emitting component formed by performing a printing process, and a commercial integrated chip (IC) may be disposed on the rigid island in another embodiment (not shown).

Referring to FIG. 8, the control device 400 obtains coordinates of electrodes to be electrically connected to each other and controls the marking device 200 to perform a wiring process of connecting the electrodes. As described above, the marking device 200 may be a printing device, and the marking device may perform a wiring operation by printing a conductive ink on a surface of a substrate. For example, the conductive ink may be an ink including silver nanoparticles, an ink including copper nanoparticles, an ink including gold nanoparticles, and an ink including carbon nano tubes (CNTs).

In one embodiment, a surface of a stretchable substrate may be modified to improve adhesion between a conductive material printed by a marking device and the surface of the stretchable substrate sub. For example, an apparatus for fabricating a stretchable electrical circuit may further include a chamber (not shown), and an ultraviolet treatment and/or ozone treatment may be performed on the surface of the stretchable substrate in the chamber to improve adhesion with respect to the conductive material.

Although the embodiments of FIGS. 7 and 8 show examples of wirings between the rigid islands using the disposed electrical components, the control device 400 may control an actuator (not shown) to dispose electrical components, such as a passive component, an active component, and a substrate on which active components and passive components are disposed and wired to perform desired functions, on desired locations in another embodiment (not shown).

In one embodiment, the control device 400 obtains coordinates of rigid islands of a substrate and forms a pattern of disposing electrical components on the rigid islands in order that a stretchable electrical circuit performs desired functions. Then, the control device 400 may perform a wiring process of electrically connecting the electrical components using the formed pattern.

After the process of disposing the electrical components is completed, the control device 400 controls the stretching device 100 to restore the stretchable substrate sub to an original state thereof. Since the wiring formed on the stretchable substrate sub is formed while the substrate is in a stretched state, the wiring has a creasy form when the stretchable substrate sub is restored to the original state. However, even when the stretchable substrate is stretched, the crease formed on the wiring is unfolded and the wiring performs a function of electrical connection without being disconnected. Even when the substrate is stretched or restored to the original state, deformation of the rigid islands is low. Accordingly, even when the substrate is restored to the original state, deformation, such as crease or the like, does not occur in the electrical components located at the rigid islands.

EXPERIMENTAL EXAMPLE

Figure 9:
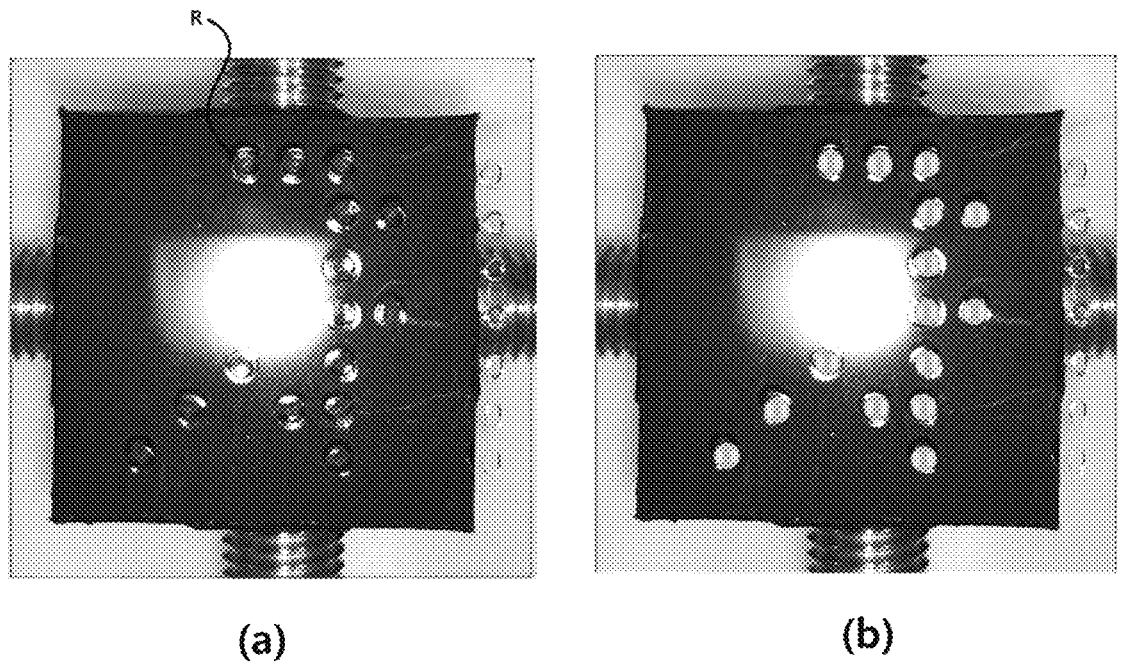
FIGS. 9 and 10 are pictures illustrating experimental results when light emitting diodes (LEDs) are mounted on a stretchable substrate and connected using the method of fabricating a stretchable electrical circuit and the apparatus for fabricating a stretchable electrical circuit according to the embodiments.
Figure 10:
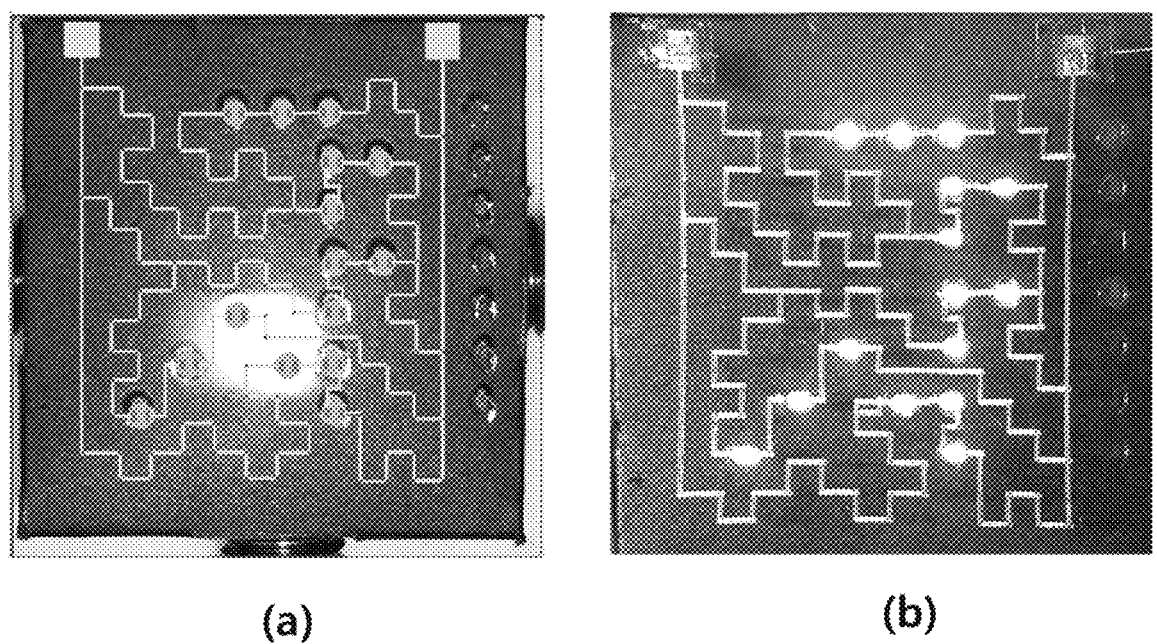

An experimental result of disposing and wiring light emitting diodes (LEDs) on a stretchable substrate using the method of fabricating a stretchable electrical circuit and the apparatus for fabricating a stretchable electrical circuit according to the embodiment will be described with reference to FIGS. 9 and 10. FIG. 9A is a view illustrating a stretchable substrate having a rigid island R formed thereon and stretched in two perpendicular directions. As shown in FIG. 9A, since the same tensile force is provided in the two perpendicular directions, the stretchable substrate is isotropically stretched.

FIG. 9B is a view illustrating LEDs disposed in a rigid island R. As described above, a process of disposing electrical components on the rigid island R may be performed by an automatic process using coordinates.

FIG. 10A is a view illustrating a pattern to be formed with respect to LEDs disposed on a stretchable substrate. A control device obtains coordinates of each electrode of the LEDs from an image provided by an image device. The control device controls a marking device to desirably connect the LEDs using the obtained coordinates. The marking device is controlled by the control device and performs wiring using a conductive ink. In the experimental example, the wiring was made by an inkjet printing process of spraying the conductive ink through a nozzle.

FIG. 10B is a view illustrating a state in which a driving voltage is supplied to a stretchable substrate on which wiring is completed and light is emitted by LEDs. As shown in FIG. 10B, it was determined that the electrical components are disposed at desired locations and driven.

In a conventional case, even when the same tensile force is applied to a stretchable substrate on which rigid islands are formed, it is difficult to estimate stretching directions and stretched degrees of the stretchable substrate on the basis of a layout and hardness of the rigid islands and a relationship between the rigid islands and the stretchable substrate. Accordingly, it is impossible to automate processes of disposing and electrically wiring components on the rigid islands.

However, according to the embodiment, coordinates of regions on a surface of a stretched stretchable substrate can be obtained, and thereby electrical components can be automatically disposed in the regions using the obtained coordinates.

It will be apparent to those skilled in the art that various modifications may be made to the above-described exemplary embodiments of the present invention without departing from the spirit or scope of the invention. Thus, it is intended that the present invention covers all such modifications provided they come within the scope of the appended claims and their equivalents.

What is claimed is:

1. An apparatus for fabricating a stretchable electrical circuit, comprising:
   a stretching device configured to stretch a mounted stretchable substrate in two different directions;
   a marking device configured to mark a mark on the stretchable substrate;
   an image device configured to obtain an image of the stretchable substrate on which a plurality of alignment marks are marked by the marking device; and
   a control device configured to control the stretching device, the image device, and the marking device,
   wherein the control device forms a first axis and a second axis using the plurality of alignment marks marked on the image obtained by the image device and marks one point of a surface of the stretchable substrate with coordinates made by the first axis and the second axis using the first axis and the second axis.

2. The apparatus according to claim 1, wherein the control device controls the plurality of alignment marks to be marked on the stretched stretchable substrate.

3. The apparatus according to claim 1, wherein the control device controls the stretchable substrate to be stretched after the plurality of alignment marks are marked.

4. The apparatus according to claim 1, wherein the stretchable substrate is a substrate on which a rigid island is formed.

5. The apparatus according to claim 1, wherein the control device forms the first axis and the second axis using a distance between two alignment marks among the plurality of alignment marks marked on the stretched stretchable substrate.

6. The apparatus according to claim 1, wherein the marking device is a printing device and prints and forms the plurality of alignment marks.

7. The apparatus according to claim 1, further comprising an arranging device configured to dispose electrical components on the substrate, wherein the electrical components include a passive component, an active component, and a circuit substrate on which the passive component or the active component is disposed.

8. The apparatus according to claim 7, wherein the marking device forms wirings configured to connect the electrical components.

* * * * *